United States Patent
Jang et al.

(10) Patent No.: US 10,683,209 B2
(45) Date of Patent: Jun. 16, 2020

(54) ULTRA-HIGH TEMPERATURE PRECIPITATION PROCESS FOR MANUFACTURING POLYSILICON

(71) Applicant: LG CHEM, LTD., Seoul (KR)

(72) Inventors: Eunsu Jang, Daejeon (KR); Yoo Seok Kim, Daejeon (KR); Jaesung Kim, Daejeon (KR); Jeong Kyu Kim, Daejeon (KR); Jin Hyoung Yoo, Daejeon (KR); Jung Woo Lee, Daejeon (KR); Ye Hoon Im, Daejeon (KR); Jun Won Choi, Daejeon (KR)

(73) Assignee: LG CHEM, LTD., Seoul (KR)

( * ) Notice: Subject to any disclaimer, the term of this patent is extended or adjusted under 35 U.S.C. 154(b) by 52 days.

(21) Appl. No.: 15/770,360

(22) PCT Filed: Mar. 17, 2017

(86) PCT No.: PCT/KR2017/002911
§ 371 (c)(1),
(2) Date: Apr. 23, 2018

(87) PCT Pub. No.: WO2017/160121
PCT Pub. Date: Sep. 21, 2017

(65) Prior Publication Data
US 2018/0297853 A1    Oct. 18, 2018

(30) Foreign Application Priority Data

Mar. 18, 2016 (KR) .................. 10-2016-0032479
Apr. 22, 2016 (KR) .................. 10-2016-0049048

(51) Int. Cl.
*C01B 33/03* (2006.01)
*C23C 16/455* (2006.01)
(Continued)

(52) U.S. Cl.
CPC .............. *C01B 33/03* (2013.01); *C23C 16/24* (2013.01); *C23C 16/4551* (2013.01);
(Continued)

(58) Field of Classification Search
CPC ....... C01B 33/03; C23C 16/24; C23C 6/4551; C23C 16/45563; C23C 16/463;
(Continued)

(56) References Cited

U.S. PATENT DOCUMENTS 4,751,067 A * 6/1988 Levin ................ B01J 19/02
                                                422/129
5,652,021 A * 7/1997 Hunt ................ C23C 16/30
                                                427/248.1
(Continued)

FOREIGN PATENT DOCUMENTS

KR  10-2003-0094018 A  12/2003
KR  10-2011-0091639 A  8/2011
(Continued)

*Primary Examiner* — Melvin C. Mayes
*Assistant Examiner* — Michael Forrest
(74) *Attorney, Agent, or Firm* — Dentons US LLP

(57) ABSTRACT

A method for manufacturing polysilicon, according to the present invention, is capable of manufacturing polysilicon with high purity more efficiently in such a manner that a high-temperature and high-speed air stream is formed at the center of a reaction tube, and a high-temperature region may be formed by a vortex formed by the high-temperature and high-speed air stream, so that a raw gas supplied from the side wall of the reaction tube flows by the guiding of the vortex, thereby increasing a stay time and a reaction time of the raw gas within the reaction tube. Furthermore, since the inner wall of the reaction tube is provided with a heat release means, the rapid cooling of a silicon crystal deposited on the inner wall of the reaction tube can induce a columnar crystal in which the silicon crystal is solidified in a direction (Continued)

perpendicular to a crystal face, and it is easy to desorb the silicon crystal produced by rapid heat release via the inner wall of the reaction tube.

15 Claims, 11 Drawing Sheets

(51) Int. Cl.
    *C23C 16/50*     (2006.01)
    *C23C 16/46*     (2006.01)
    *C23C 16/24*     (2006.01)
    *H01L 21/02*     (2006.01)

(52) U.S. Cl.
    CPC ...... *C23C 16/45563* (2013.01); *C23C 16/463* (2013.01); *C23C 16/50* (2013.01); *H01L 21/0262* (2013.01); *H01L 21/02532* (2013.01); *H01L 21/02595* (2013.01)

(58) Field of Classification Search
    CPC ......... C23C 16/50; C30B 21/02; C30B 25/00; C30B 29/06
    See application file for complete search history.

(56) References Cited

U.S. PATENT DOCUMENTS

2010/0189926 A1\* 7/2010 DeLuca ................ C01B 33/027
                                                                     427/578
2016/0107894 A1     4/2016 Pedron

FOREIGN PATENT DOCUMENTS

| KR | 10-2013-0018673 A | 2/2013 |
| KR | 10-2013-0019568 A | 2/2013 |
| KR | 10-2013-0039486 A | 4/2013 |
| KR | 10-2016-0006756 A | 1/2016 |

\* cited by examiner

[Fig. 1]
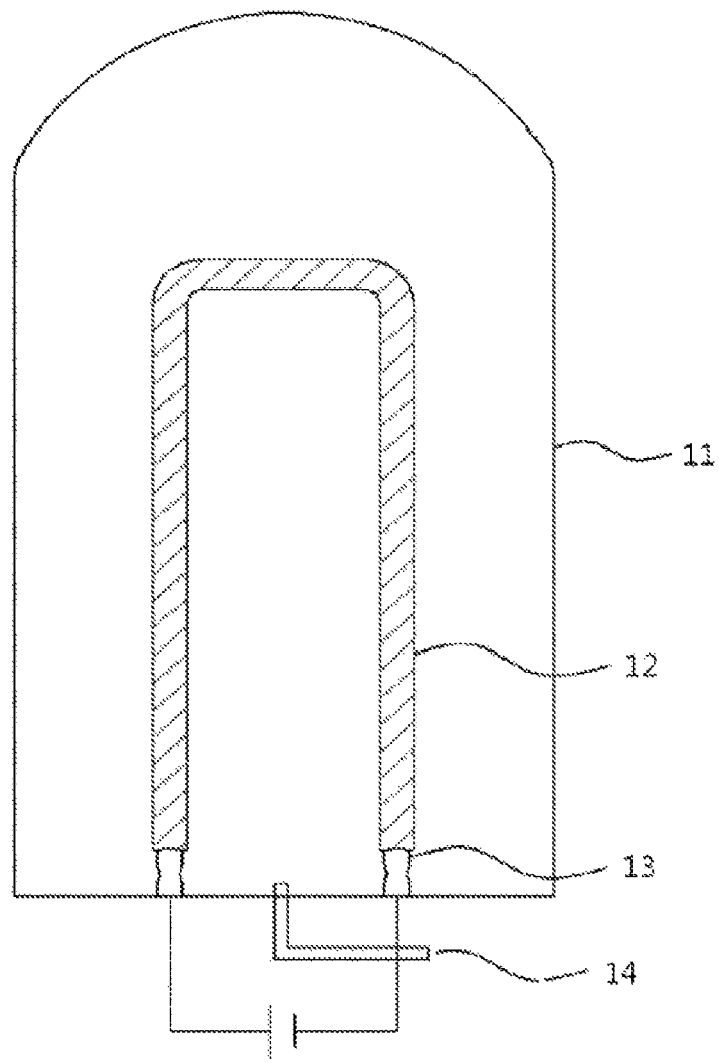
CONVENTIONAL

[Fig. 2]
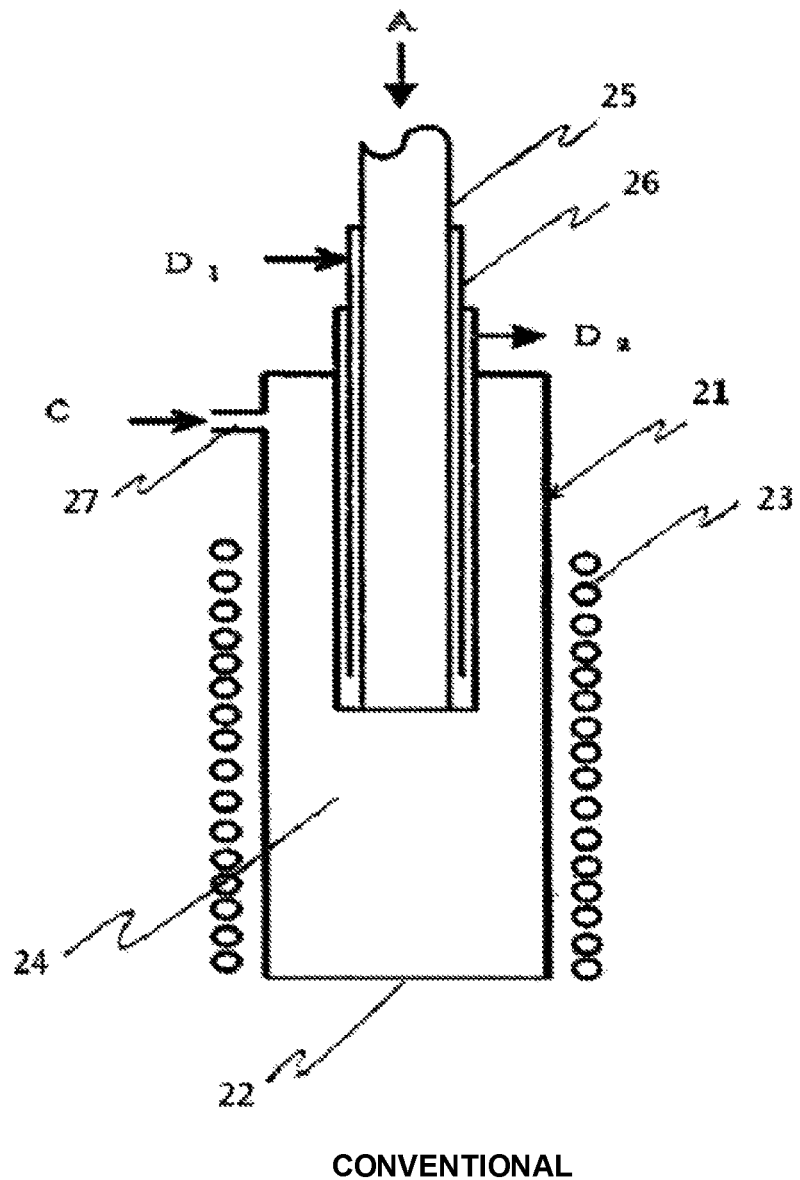
CONVENTIONAL

[Fig. 3]
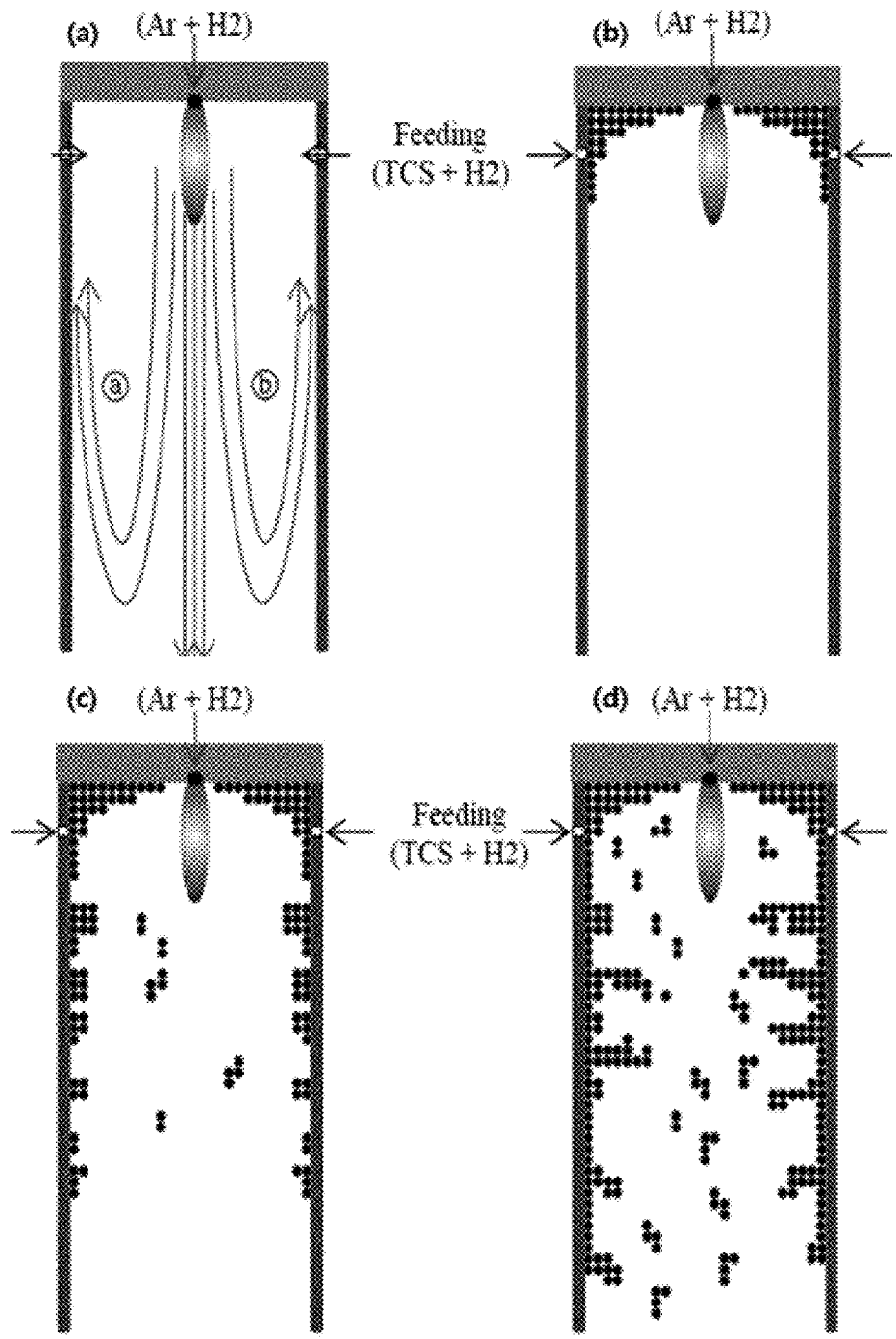

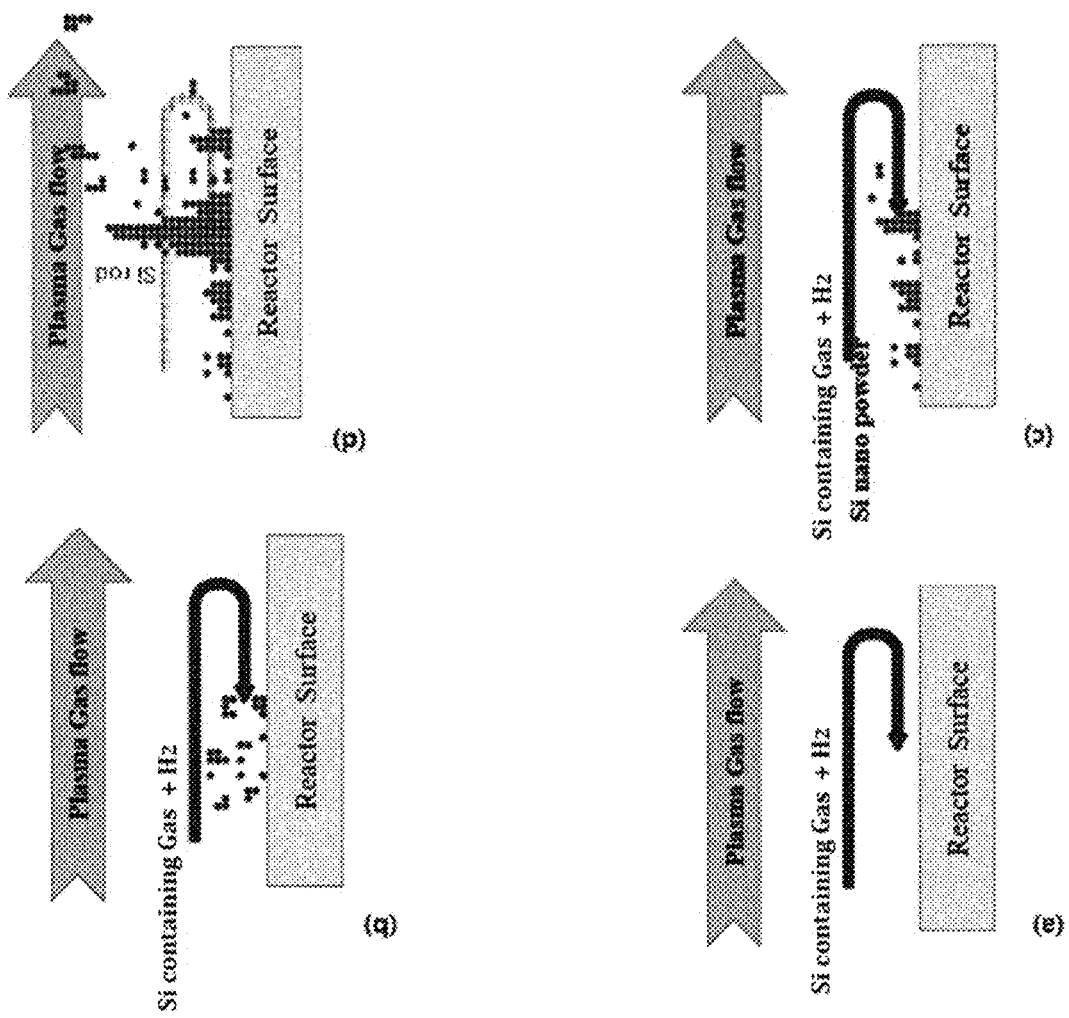
[Fig. 4]

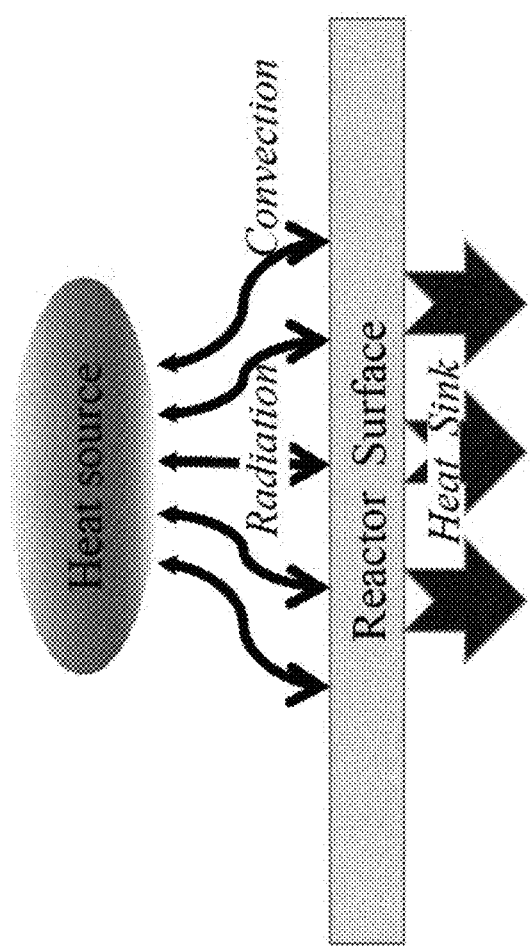
[Fig. 5]

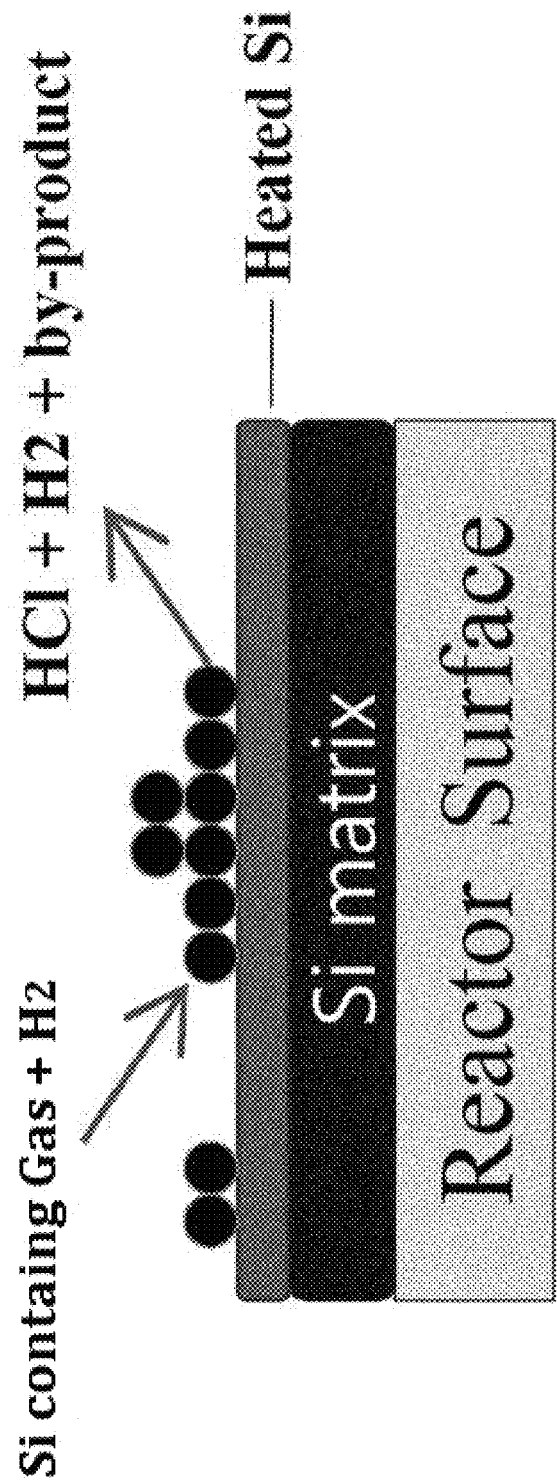
[Fig. 6]

[Fig. 7]
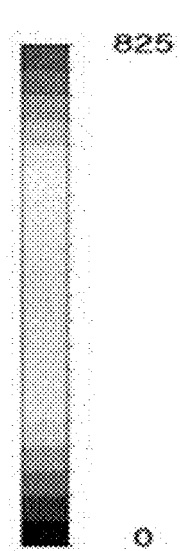 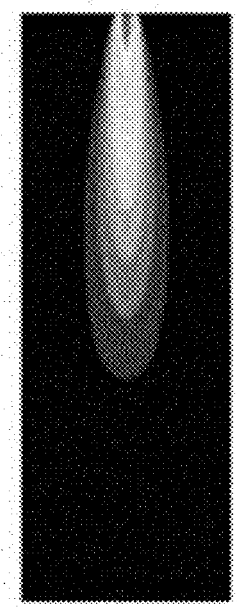 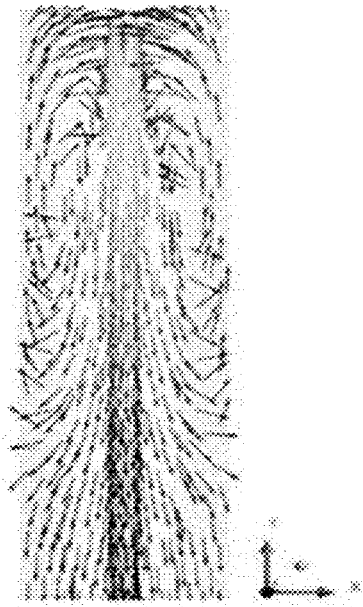
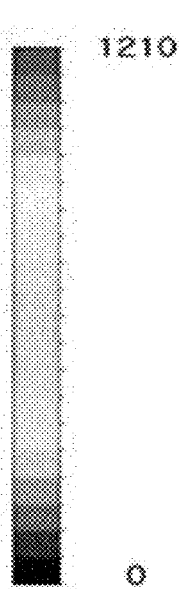 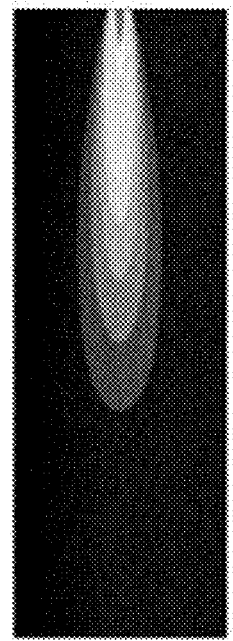 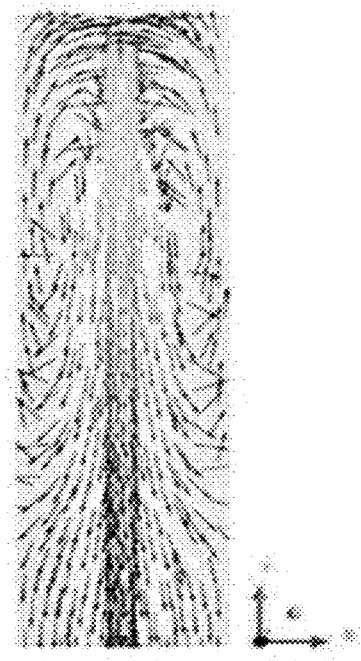

[Fig. 8]
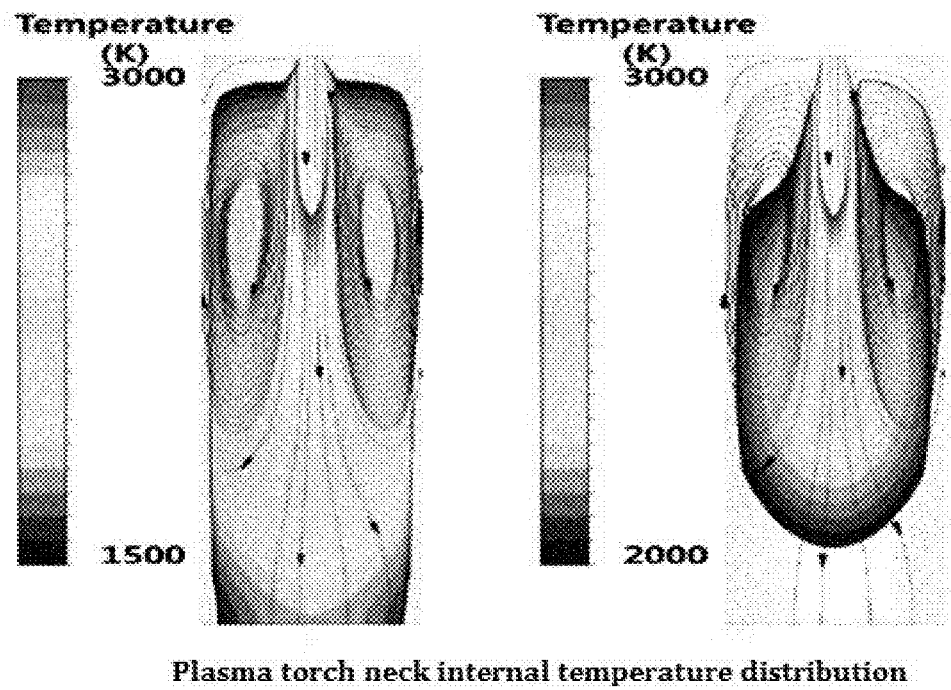
Plasma torch neck internal temperature distribution
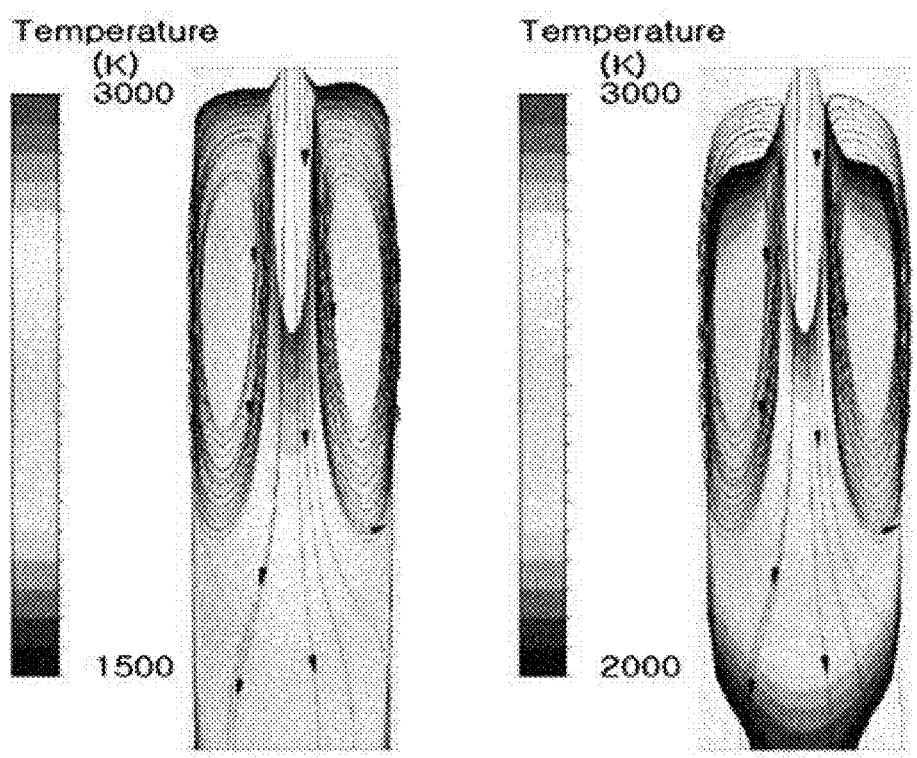

[Fig. 9]
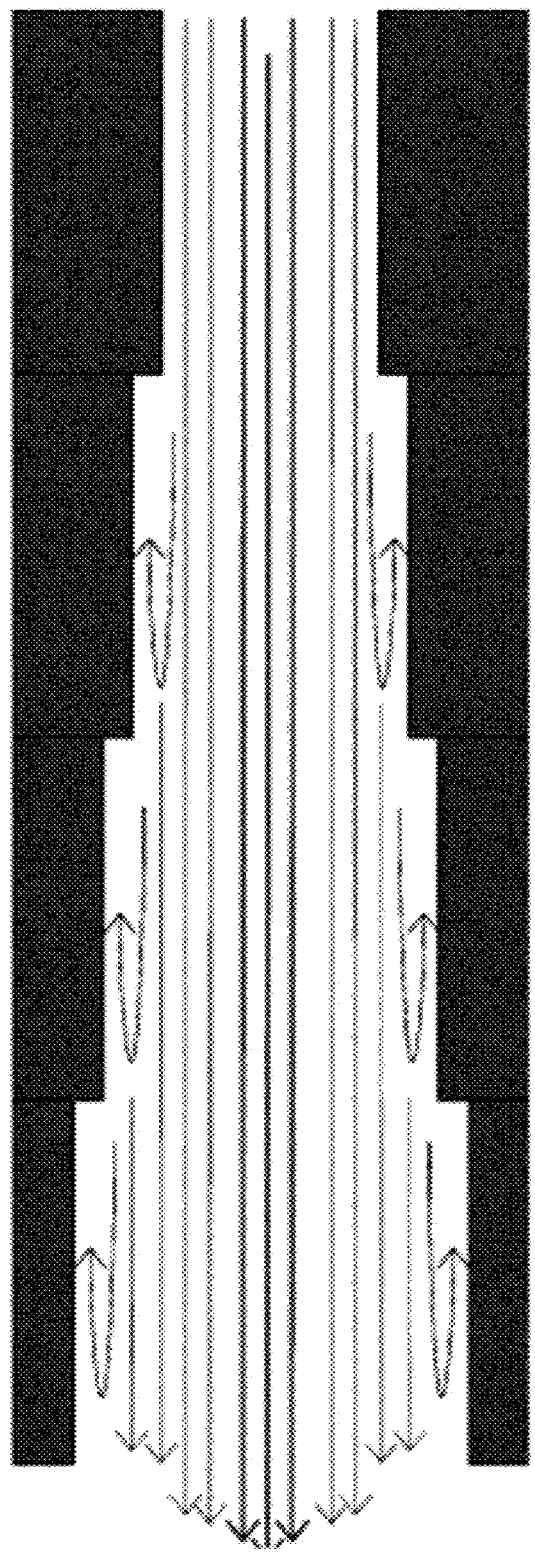

[Fig. 10]
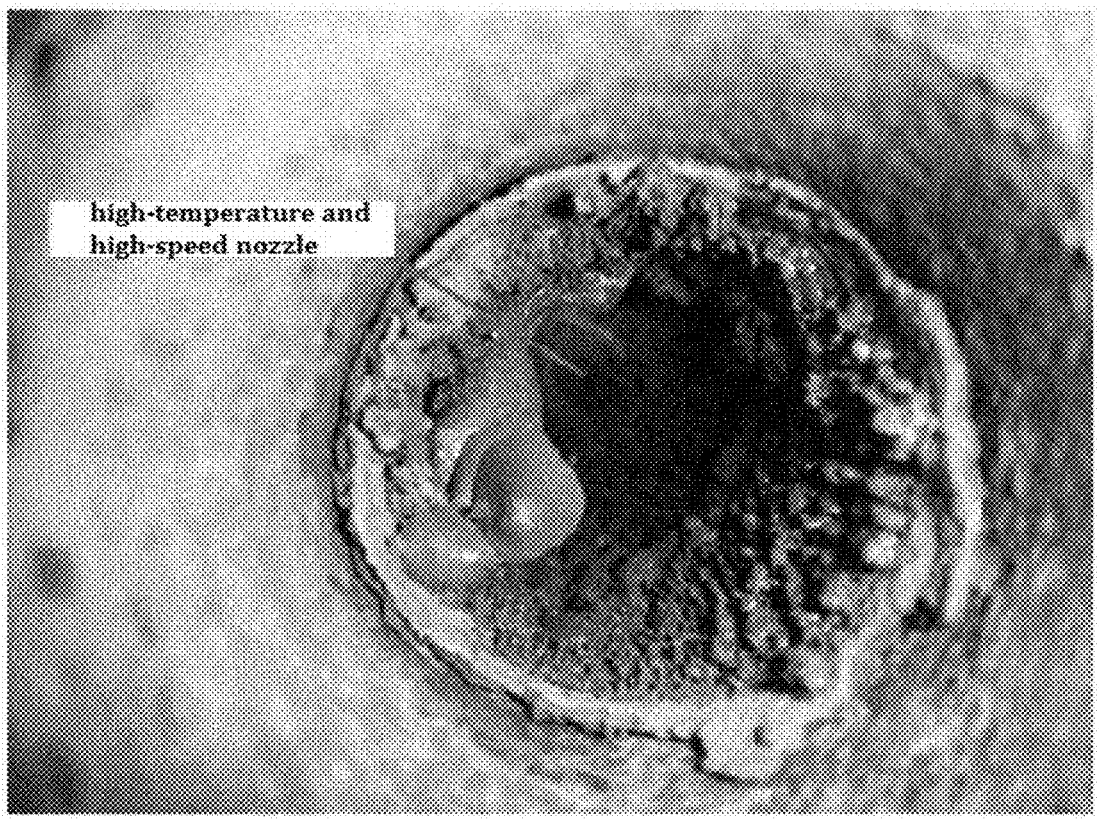

[Fig. 11]
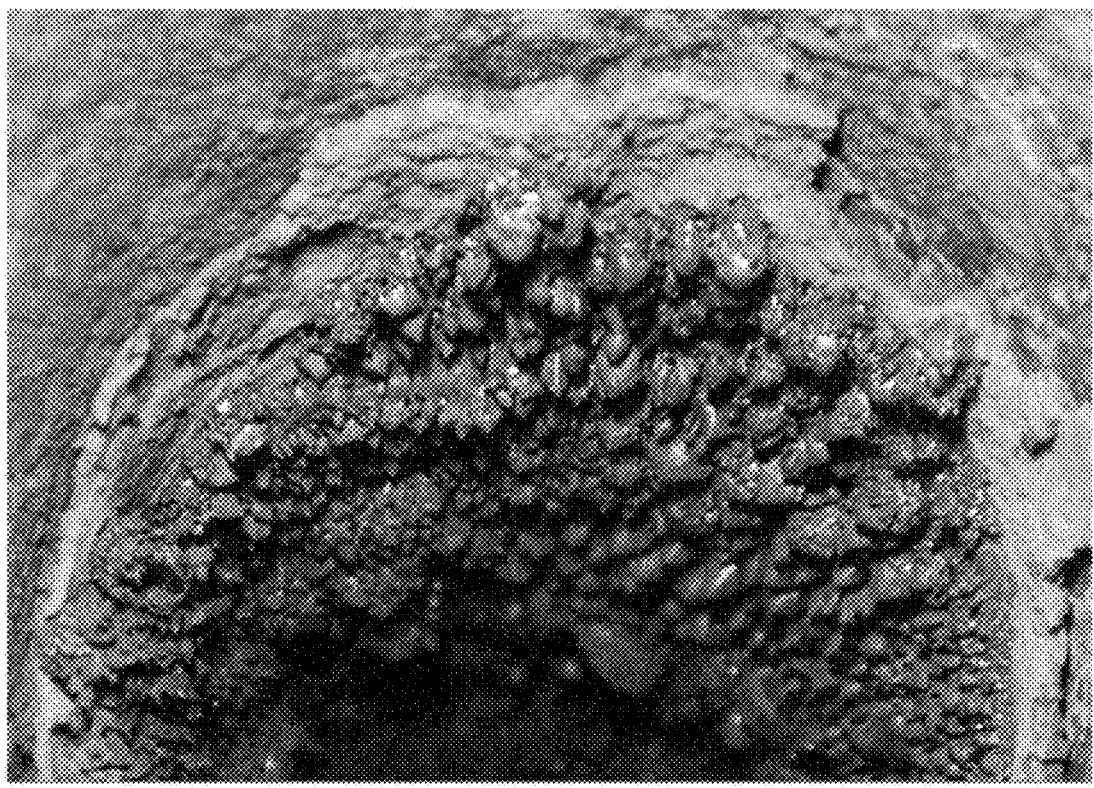

ULTRA-HIGH TEMPERATURE PRECIPITATION PROCESS FOR MANUFACTURING POLYSILICON

TECHNICAL FIELD

This application is a National Stage Entry of International Application No. PCT/KR2017/002911 filed on Mar. 17, 2017, and claims the benefit of Korean Application No. 10-2016-0032479, filed on Mar. 18, 2016, and Korean Patent Application No. 10-2016-0049048, filed on Apr. 22, 2016, all of which are hereby incorporated by reference in their entirety for all purposes as if fully set forth herein.

The present invention relates to a precipitation process capable of efficiently producing high purity polysilicon and an apparatus therefore.

BACKGROUND ART

Polysilicon is a raw material for semiconductor devices, solar cell devices, and the like, and the demand thereof is increasing recently. Conventionally, various methods for producing silicon which is a raw material for a semiconductor or a solar cell have been known, and some of them have already been carried out industrially.

Most commonly used high purity polysilicon is produced by chemical vapor deposition. Specifically, it can be produced by reacting trichlorosilane gas with a reducing gas such as hydrogen gas, as shown in Reaction formula 1 below.

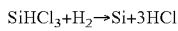    [Reaction Formula 1]

An example of commercially available methods is the Siemens method. FIG. 1 is a schematic view of an apparatus for producing polysilicon according to a conventional Siemens method. As shown in FIG. 1, in the polysilicon manufacturing apparatus according to the Siemens process, a silicon rod 12 is provided inside a vertical reaction tube 11, and the end of the silicon rod 12 is connected to the electrode 13. In addition, a gas supply nozzle 14 for supplying a reaction gas, trichlorosilane gas and hydrogen gas, is provided inside the reaction tube.

A method of forming polysilicon using the Siemens reaction tube constructed as described above will be described below. First, a current is supplied to the silicon rod 12 through the electrode 13, and the reaction gas is supplied into the reaction tube through the gas supply nozzle 14. The silicon rod 12 is heated by the supplied electric power to a surface temperature of about 1000 to 1150 □ and the reaction gas is pyrolyzed on the surface of the heated silicon rod 12, and thereby a high purity polysilicon is deposited on the silicon rod 12.

However, such a conventional Siemens reaction tube consumes a large amount of electrical energy, typically about 65 to 200 KWh/kg, and the cost for such electrical energy accounts for a very large portion of the cost of manufacturing the polysilicon. Further, since the precipitation is a batch type, there is a problem that an extremely complicated process such as installation of a silicon rod, electrification heating, precipitation, cooling, extraction, and vertical reaction tube cleaning must be performed.

Another method is the precipitation by using a fluidized bed. This method continuously produces silicon grains of 1 to 2 mm by supplying silane type material while supplying fine grains of about 100 microns as precipitation nuclei using a fluidized bed and precipitating silicon on silicon fine particles. This method has an advantage that it can be operated continuously for a relatively long period of time. However, since monosilane having a low precipitation temperature is used as a raw material for silicon, generation of fine particles of silicon by thermal decomposition of monosilane and precipitation of silicon onto the reaction tube wall are likely to occur even at a relatively low temperature, and thereby periodic cleaning or replacement of the reaction vessel is necessary.

Also, in Japanese Patent Laid-Open Publication No. H11-314996, it is disclosed a method using an apparatus having an exothermic solid, a high-frequency coil disposed to face a lower surface of the exothermic solid and at least one gas ejection port provided on the coil surface, and ejecting a raw gas containing a precipitation component at a lower surface of the heating body induction-heated by the high-frequency coil from the gas ejection port to perform precipitation and dissolution of the precipitation component on the lower surface of the heating body, and then producing a crystalline, for example, polycrystalline silicon, by dripping or flowing out a molten liquid from the bottom of the exothermic solid. However, according to said method, since the high-frequency coil and the exothermic solid are close to each other, the high-frequency coil requiring water cooling needs to take heat to maintain its function, resulting in low energy efficiency.

On the other hand, FIG. 2 discloses another apparatus for producing a polysilicon, in which a heating body which is a silicon deposition surface is formed into a tubular shape and the thermal efficiency is increased (see Korean Patent Publication No. 10-0692444). The apparatus comprises (a) a tubular container 21 having an opening serving as a silicon outlet at the lower end, (b) a heating device 23 for heating the inner wall from the lower end of the tubular container to an arbitrary height to a temperature equal to or higher than the melting point of silicon, (c) a chlorosilane supply pipe 25 comprising an inner tube having an outer diameter smaller than the inner diameter of the tubular container 21, one end of the inner tube being installed facing down in a space 24 surrounded by the inner wall heated to a temperature not lower than the melting point of silicon, and (d) a first sealing gas supply pipe 27 for supplying a sealing gas to the gap formed by the inner wall of the tubular container 21 and the outer wall of the chlorosilane supply pipe 25, and, in some cases, further comprise (e) a hydrogen supply pipe for supplying hydrogen gas into the tubular container. In said patent, the heating device 25 is described to be usable as a device capable of heating to a temperature higher than the melting point of silicon, that is, 1414° C. or higher, and a heating device using a high frequency, a heating device using a heating wire, and a heating device using an infrared ray are taken as an example.

Meanwhile, Japanese Patent Publication No. 4743730 discloses a method of manufacturing a silicon thin film by thermal plasma CVD. The Japanese patent discloses that by generating an electrothermal plasma by a complex plasma in which a high-frequency (RF) plasma is superimposed on a DC plasma, a deficiency of each plasma is supplemented to have a synergistic effect. However, in the DC plasma, a metal electrode must be inserted into the reaction vessel and this electrode must be in direct contact with the plasma. The electrodes exposed to the plasma gradually deteriorate and may cause impurities to be mixed.

Also, in the conventional vertical reaction tube, the polysilicon is produced on the surface of the reaction tube and is the produced polysilicon is melted, and then the polysilicon is collected from the lower collecting section. In this case, the raw gas supplied in the vertical direction passes through the vertically-shaped reaction tube without proceeding to the precipitation reaction at a high temperature in contact with the surface of the vertically-shaped reaction tube, resulting in lowering of production efficiency and lowering of energy efficiency. The polysilicon manufacturing process essentially comprises a vent gas collecting (VGR) process for collecting and recycling unreacted raw gas, hydrogen, and hydrogen chloride, which is a reaction byproduct, from the gas discharged from the reaction chamber. For example, hydrocarbons or unreacted chlorosilanes can be reused for the silicon deposition or precipitation process after being collected, and hydrogen chloride can be reused for the chlorosilane synthesis process. For example, in an actual process, conventional Siemens apparatus use two VGR systems per two deposition units.

DISCLOSURE

Technical Problem

It is an object of the present invention to provide a method and an apparatus capable of more efficiently producing high purity polysilicon.

Technical Solution

A first aspect of the present invention provides a method for manufacturing polysilicon, comprising:

forming a high-temperature and high-speed air stream at the center of the reaction tube and forming a vortex around the high-temperature and high-speed air stream;

supplying a raw gas containing a chlorosilane gas and a reducing gas from the side of the reaction tube to be guided by the vortex to flow;

forming a silicon fine powder by a reaction of the raw gas guided by the vortex; and precipitating silicon crystal by the silicon fine powder and the raw gas guided by the vortex being transferred to the inner wall of the reaction tube and being adsorbed and reacted.

A second aspect of the present invention, the method for manufacturing polysilicon may further comprises a heat releasing means for cooling the inner wall of the reaction tube, such that heat is released from the center of the reaction tube through the inner wall of the reaction tube, and silicon crystal is formed by directional solidification in which silicon crystal are formed in a direction opposite to the direction of heat release.

Further, the reaction tube may be in the form of a vertical reaction tube, and a high-temperature and high-speed air stream is injected at the center of the upper part of the vertical reaction tube, and the silicon crystal is desorbed and collected into the lower part the reaction tube, when the silicon crystal being deposited on the inner wall of the vertical reaction tube grow over a predetermined size.

Also, the silicon crystal may be grown in a certain direction toward the center of the reaction tube opposite to the heat releasing direction in the form of a silicon rod or a whisker to be a predetermined size or more, and be then desorbed and dropped by gravity or physical stimulation.

Also, the cross section of the remaining silicon crystal may be provided as the silicon growth surface in the subsequent silicon manufacturing process, after the initial silicon crystal deposited on the inner wall of the reaction tube or the polysilicon crystal formed on the inner wall of the reaction tube is collected.

Also, the silicon crystal deposited on the surface of the inner wall of the reaction tube may be directly or indirectly heated by radiant heat and convection heat transferred from the heat source at the center of the reaction tube, and the heated silicon crystal layer may supply heat energy required for the reaction of the reaction raw materials and the silicon deposition reaction.

Also, the temperature of the high-temperature and high-speed air stream may be 1500 K or more, and the vortex formed around the high-temperature and high-speed air stream forms a high temperature region of 1450 K or more.

Also, the sprayed raw gas may be guided by the vortex to form a convection, and thereby the stay time of the raw gas may be increased.

Also, the surface temperature of the inner wall of the reaction tube may be 1400 K or less.

Also, the heat energy transferred to the inner space of the reaction tube and the inner wall of the reaction tube may be convection heat generated by the vortex formed by the high-temperature and high-speed air stream.

Also, the polysilicon formed on the surface of the inner wall of the reaction tube may grow to be a predetermined size or more, and thereby may be desorbed and separated by the high-temperature and high-speed air stream.

Also, speed flow may be 10 m/s or more at the top portion of the high-temperature and high-speed air stream.

Also, the raw material of the gas generating the high-temperature and high-speed air stream may be at least one selected from argon, helium, nitrogen, and hydrogen.

Also, a silicon matrix may be formed with silicon crystal precipitated by the raw gas and the silicon fine powder adsorbed on the surface of the inner wall of the reaction tube, and with the silicon matrix as a reaction surface, the adsorption of the silicon fine powder and the reaction of the raw gas occur, and thereby silicon crystal may be precipitated on the silicon matrix.

Also, the silicon matrix may form a heated silicon layer from the thermal energy delivered by the vortex, and the heated silicon layer may supply heat energy necessary for the step of precipitating silicon crystal by adsorption and reaction of the silicon fine powder and the raw gas.

Also, the present invention provides an apparatus for manufacturing polysilicon, comprising:

a nozzle located at an upper part of the reaction tube and supplying a high-temperature and high-speed air stream to the center of the reaction tube; and a raw gas supply portion for supplying a raw gas containing a chlorosilane gas and a reducing gas, wherein the raw gas supply portion is located at the side of the reaction tube.

Also, the surface of the inner wall of the reaction tube may comprise a stepped structure, and a vortex may be respectively formed at each step of the stepped structure.

Also, the inner diameter of the reaction tube gradually may increase toward the bottom of the reaction tube.

Advantageous Effects

In the method for manufacturing polysilicon according to the present invention, a vortex due to a high-temperature and high-speed air stream may be formed at the center of the reaction tube. The raw gas may be guided on the vortex and flow, and the stay time and the reaction time of the raw gas in the reaction tube are increased, so that it is possible to manufacture a high purity polysilicon more efficiently. Further, by providing the means for discharging heat through the inner wall of the reaction tube, the heat inside the reaction tube flows from the center toward the outside through the inner wall of the reaction tube, so that it enables columnar crystal growth, where silicon crystal solidifies in one direction. This heat dissipation causes silicon crystal to grow at a high rate in the direction opposite to the direction of heat dissipation during the growth of silicon crystal. In this case, since the crystal is weakened by high speed solidification, the bonding force between the silicon crystal is weakened and the silicon may be easily desorbed from the surface of the reaction tube, so that the collecting of the polysilicon is easier.

DESCRIPTION OF DRAWINGS

FIG. 1 is a schematic view showing a general structure of a Siemens reaction tube which is one of conventional polysilicon manufacturing apparatuses.

FIG. 2 is a schematic view showing another form of a conventional polysilicon manufacturing apparatus.

FIG. 3 schematically shows a process of ultra-high temperature precipitation of polysilicon according to the first aspect of the present invention.

FIG. 4 is a graph showing changes in the surface of the inner wall of the reaction tube according to the ultra-high temperature precipitation process of the polysilicon according to the first aspect of the present invention.

FIG. 5 shows the movement of heat at the inner wall of the reaction tube in the method according to the second aspect of the present invention.

FIG. 6 schematically shows the structure of the inner wall of the reaction tube formed with a heated Si layer on a silicon matrix according to the present invention.

FIG. 7 shows the CFD simulation of the velocity distribution by the high-temperature and high-speed air stream formed at the center of the reaction tube.

FIG. 8 shows a CFD simulation of the heat distribution due to the high-temperature and high-speed air stream formed at the center of the reaction tube.

FIG. 9 is a schematic view illustrating a structure of an inner wall of a reaction tube having a stepped structure according to an embodiment of the present invention.

FIGS. 10 and 11 are photographs of the inner walls of the reaction tubes of the embodiments according to the first and second aspects of the present invention, respectively.

BEST MODE

Hereinafter, the present invention will now be described in detail with reference to the embodiments of the present invention shown in the accompanying drawings. It should be understood, however, that the present invention is not intended to be limited to any particular embodiment, but comprises all modifications, equivalents, or alternatives falling within the spirit and scope of the present invention.

Throughout the figures of the present invention, similar reference numbers refer to the similar elements.

The terms first, second, A, B, etc., may be used to describe various components, but the components are not limited by the terms, but only may be used to distinguish one component from another.

In the present invention, the term "and/or" means comprising any one or a combination of a plurality of the described contents.

In the present invention, when an element is referred to as being "connected" or "coupled" to another element, it is understood that the element may be directly connected or coupled to the another element or be connected or coupled to another element via the other element.

In the present invention, the singular expressions comprise plural expressions unless otherwise specified.

In the present invention, the terms "comprising", "comprising", or "having" mean that there is a feature, a numerical value, a step, an operation, an element, a component or a combination thereof described in the specification, and do not preclude a possibility that other features, numbers, steps, operations, components, parts, or combinations thereof may be present or added.

The present invention provides a process of ultra-high temperature precipitation of polysilicon comprising:

forming a high-temperature and high-speed air stream at the center of the reaction tube and forming a vortex around the high-temperature and high-speed air stream;

supplying a raw gas containing a chlorosilane gas and a reducing gas from the side of the reaction tube;

the raw gas being guided by the vortex and flowing;

forming a silicon fine powder by a reaction of the raw gas; and precipitating silicon crystal by the silicon fine powder and the raw gas guided by the vortex being transferred to the inner wall of the reaction tube and being adsorbed and reacted.

According to the preferable embodiment, the reaction tube is in the form of a vertical reaction tube, and a high-temperature and high-speed air stream is injected at the center of the upper part of the vertical reaction tube, and the silicon crystal is desorbed and collected into the lower part the reaction tube, when the silicon crystal being deposited on the inner wall of the vertical reaction tube grow over a predetermined size.

In addition, when a high-speed air stream is formed in the center of the reaction tube, the raw gas may be supplied from the side of the reaction tube. This is to prevent the raw gas from escaping with the high-speed air stream without staying in the reaction tube.

The flow velocity of the high-speed air stream may be 10 m/s or more, or 100 m/s or more, and the maximum flow velocity at the reaction tube center or the top of the reaction tube center may be at least 10 m/s, or at least 100 m/s, or at least 500 m/s, preferably at least 800 m/s, more preferably at least 1000 m/s, and at most 2000 m/s or less.

The vortex formed from the high-temperature and high-speed air stream flows the raw gas supplied from the side of the reaction tube and the heat energy formed the high-temperature and high-speed air stream, thereby increasing the time during which the raw gas guided by the vortex stays in the reaction tube, since the vortex transmits heat energy to the whole reaction tube, it is possible to more effectively form the high temperature region in the reaction tube, thereby improving the process efficiency. Also, the raw gas reacts in the high temperature region to form a silicon fine powder, and the silicon fine powder and the raw gas are transferred to the inner wall of the reaction tube to precipitate silicon crystal. Therefore, the high-temperature and high-speed air stream formed at the center of the reaction tube serves as a source of kinetic energy and thermal energy inside the reaction tube. Further, the vortex formed by the high-speed air stream may effectively supply the kinetic energy and the heat energy resulting from the air stream. That is, in the case of the flow motion of the air stream by the heating device, heat transfer and flow are made based on the convection due to the temperature difference, and thereby it is difficult to form the high temperature region. However, according to the present invention, the heat energy formed the high-temperature and high-speed air stream flows with the vortex, and thereby it enables more effective heat transfer.

[Mode for Invention]

FIG. 3 shows an ultra-high temperature precipitation process of polysilicon according to the present invention.

Referring to FIG. 3, in step (a), a high-temperature gas is injected into the reaction tube at a high speed to form a high-temperature and high-speed air stream, and a vortex may be formed around the high-temperature and high-speed air stream. The high-temperature regions of (a), (b) may be formed by the thermal energy transferred by the vortex. In addition, the raw gas containing chlorosilane and the reducing gas supplied from the side of the reaction tube may be guided on the vortex to flow, and the raw gas reacts in the high-temperature regions of (a), (b) to form a silicon fine powder.

In the steps (b) and (c), the raw gas and the silicon fine powder are transferred to the surface of the reaction tube by the vortex and be adsorbed and reacted, so that the silicon crystal may be precipitated on the inner wall of the reaction tube. The silicon crystal precipitated on the surface of the reaction tube may gradually grow and be grown in the form of a silicon rod or a silicon whisker toward the center of the reaction tube, that is, the high-temperature and high-speed air stream.

In the step (d), the silicon rod or the silicon whisker grown on the surface of the reaction tube is separated or desorbed by a high flow-velocity of the high-temperature high-speed air stream and falls down to the bottom of the reaction tube in the form of particles, and the raw gas and the silicon fine powder are reacted with the cross section of the silicon crystal remaining on the surface of the reaction tube as the reaction surface, so that the silicon crystal growth and desorption process may be continuously occur, and in this way, the ultra-high temperature precipitation process may be continuously performed.

FIG. 4 shows the reaction at the surface of the reaction tube in steps (a), (b), (c) and (d) of FIG. 3, in more detail. In FIG. 4, step (a) shows a step of the raw gas being guided by the vortex, which is formed by the high-temperature and high-speed air stream, and flowing at the inner wall of the reaction tube, step (b) shows that the raw gas reacts in a high-temperature region formed by the vortex to form a silicon fine powder, and the silicon fine powder and the raw gas are transferred to the inner wall of the reaction tube by vortex to be adsorbed and reacted, and thereby that crystal are precipitated on the surface of the reaction tube. Step (c) shows that, according to continuous adsorption and reaction of the raw gas and the silicon fine powder, the silicon crystal grow in the form of whiskers or silicon rods on the surface of the reaction tube. Step (d) shows that the silicon crystal grown in the form of the whiskers or the silicon rods grow to a predetermined size or larger, and thereby are separated and dropped by the high-temperature and high speed air stream. in this case, the separated silicon crystal may be separated in the form of particles and powder and collected in the lower part of the reaction tube.

According to another aspect of the present invention, the apparatus further comprises a heat releasing means for cooling the inner wall of the reaction tube, and thereby the heat of the inner wall of the reaction tube may be quickly released. Thereafter, the silicon deposited or precipitated on the inner wall surface of the reaction tube is rapidly solidified and crystallized to grow into a weak crystalline state, and thereby the silicon crystal grown over a predetermined size may be easily desorbed.

The heat flow in the reaction tube is directed from the center of the reaction tube to the outer wall of the reaction tube by the heat releasing means, and the silicon crystal may grow in the form of a silicon rod or a whisker in the direction of the center of the reaction tube opposite to the heat flow in the reaction tube.

The present invention comprises a heat source for supplying heat energy inside the reaction tube to the center of the reaction zone of the reaction tube, and the heat energy supplied from the heat source may be transferred from radiant heat or convection heat.

In addition, the heat source may form a high temperature, for example, a heat energy of at least 1000 K, preferably at least 1500 K, more preferably at least 2000 K, and the heat source may be formed by a resistance heating device, a high temperature gas, or a thermal plasma.

The high temperature gas and the plasma gas may be at least one gas selected from argon, helium, nitrogen, and hydrogen, and may be an argon/hydrogen mixed gas, an argon/nitrogen mixed gas, an argon gas, or a nitrogen gas. The gas is heated to 1000 K or more and injected into the reaction tube at a high speed to form a high-temperature and high-speed air stream.

More specifically, when silicon crystal grown in one direction by columnar crystal growth toward the reaction tube center are grown over a predetermined size, even if it is desorbed and separated by the air stream and falls or the high-speed air stream is not formed, it is heated by the heat source formed in the center and is desorbed or the bonding force with the reaction tube wall due to the weak crystal growth is weakened or the bonding force between crystals is weakened, and thereby it is naturally released by gravity or may be desorbed naturally due to other complex physical force. Accordingly, it enables to obtain a silicon crystal produced much more effectively rather than a method of obtaining a silicon crystal by separately taking out the seed rod to obtain a silicon deposited by inserting a conventional silicon seed rod.

Here, the thermal plasma may mean a general thermal plasma, which means a plasma formed by DC arc discharge or RF inductively coupled discharge. As the plasma-generation gas for generating the thermal plasma, an inert gas such as argon (Ar) gas, helium, or nitrogen, or air, hydrogen, or the like may be used, and preferably argon gas, more preferably argon gas and hydrogen may be used together.

In addition, the raw gas comprises chlorosilane and a reducing gas, and may further comprise silicon fine powder (nano powder) as needed.

According to one embodiment, the heat flow inside the reaction tube may naturally have a flow direction from the center of the reaction tube toward the inner wall due to the action of the heat releasing means.

The silicon crystal according to the present invention may grow crystal in the opposite direction of the heat flow, the silicon crystal plane is rapidly cooled by the rapid heat release through the reaction tube wall, and the raw gas is deposited and precipitated at a high rate at the rapidly cooled crystal surface, so that the crystal grows mainly in the columnar crystal structure. Further, the silicon crystal formed under the rapid cooling condition may be grown in a state where the mechanical strength and the structure of the silicon crystal are weak, and therefore, the silicon may easily be desorbed from the surface of the reaction tube.

FIG. 5 shows how the heat transfer in the inner wall of the reaction tube occurs in the case where the heat releasing means is provided. Radiation heat and convection heat emitted from the heat source formed at the center of the reaction tube heats the inner wall of the reaction tube, and the heated heat is quickly released to the outside by a heat exchanger that cools the reaction tube wall. Thereby, the silicon deposited on the inner wall of the reaction tube forms a solid phase, due to the rapid cooling effect by the cooling means, the solid phase is grown as a columnar crystal growth and thereby is uniformly grown to be perpendicular to the inner wall and be in the horizontal direction on the cross section of the reaction tube, and the silicon crystal to be reacted subsequently grows along the growth direction.

According to one embodiment, the heat releasing means may form a heat sink as a heat exchanger that circulates cooling water on the wall of the reaction tube to absorb the heat of the inner wall of the reaction tube.

The heat releasing means may be a heat exchanger comprising:

a cooling pipe installed on a wall of the reaction tube to supply cooling water;

a supply pump and a return pump circulating and supplying the cooling water to the cooling pipe; and a cooler for re-cooling the heated cooling water supplied from the return pump.

Referring to FIG. 6, the silicon crystal initially formed on the inner wall of the reaction tube forms a silicon matrix layer, and silicon adsorption and reaction by the raw gas and the silicon fine powder are continuously performed based on the silicon matrix layer, and silicon crystal growth may occur on the surface of the reaction tube in the form of precipitating silicon crystal on the initially formed silicon matrix layer.

According to one embodiment, the surface of the silicon matrix formed on the surface of the reaction tube at the initial stage is heated by thermal energy transferred from the vortex, thereby forming a silicon layer heated to a predetermined temperature or higher, and the heated silicon layer may serve to supply heat energy in the course of adsorption and reaction of the silicon fine powder and the raw gas on the surface of the reaction tube. Silicon crystal formed on the basis of the silicon matrix layer may block the inflow of impurities from the outside, and high-purity silicon may be produced. The silicon crystal grown on the silicon matrix are grown horizontally to the center of the reaction tube, and silicon rods and whiskers grown over a predetermined length are desorbed by high-speed and high-temperature air stream formed at the center of the reaction tube and fall down in the form of particles into the lower part of the reaction tube and may be collected, and the surface of the silicon crystal, which remains on the inner wall of the reaction tube after the silicon crystal is desorbed, may act as a crystal growth surface where silicon crystal can grow with by reacting with the raw gas.

According to one embodiment, the method for manufacturing polysilicon of the present invention may be by CVD, a raw gas containing gaseous chlorosilane gas, a reducing gas, silicon fine powder and the like reacts on the inner wall of the reaction tube to deposit and precipitate silicon crystal.

A reducing gas may be supplied together with the chlorosilane gas, and the reducing gas is preferably hydrogen. The amount of the reducing gas relative to the raw gas may be supplied in an amount of 5 to 10% by volume.

The chlorosilane raw gas may comprise any one of monosilane, dichlorosilane, trichlorosilane (TCS), and tetrachlorosilane (STC), and trichlorosilane is most preferable. The reaction temperature, the pressure and the electrical power of the reaction space is as high as possible.

FIGS. 7 and 8 show distributions of vortices derived from a high-temperature and high-speed air stream and radiant heat distributions inside a reaction tube with a CFD simulation.

FIG. 7 shows the flow velocity distribution of the high-speed air stream of the high-speed thermal plasma formed at the center of the reaction tube and the formation of the vortex extending to the top of the reaction tube within the tubular reaction tube formed by the high-speed air stream. The raw gas flowing in the side of the reaction tube by the vortex is transferred to the surface of the reaction tube to form silicon crystal through the reaction on the surface of the reaction tube.

FIG. 8 shows the temperature distribution inside the reaction tube, which is formed by the high-temperature and high-speed air stream formed in the center of the upper part of the reaction tube. A high-temperature region is formed inside the reaction tube by the high-temperature and high-speed air stream at the center of the reaction tube and the convection heat transfer by the vortex at the side of the reaction tube. A higher storage temperature may be obtained when the vortex coexists, compared to the case where only a linear flow is formed inside the reaction tube, and thereby, it is possible to maintaining a relatively high reaction tube temperature and supply the energy required for the reaction more efficiently.

In addition, radiant heat formed from the high-temperature and high-speed air stream exists in the reaction tube in addition to the convection heat generated by the vortex. In this case, the radiant heat formed inside the reaction tube becomes the largest at the top of the high-temperature high-speed air stream, that is, in the vicinity of the spraying opening sprayed from the nozzle. The heat energy inside the reaction tube according to the present invention may be mostly transferred from convection by vortex.

The present invention may increase the stay time at the reaction tube of the raw gas by using the vortex by the high-speed air stream of the thermal plasma as described above, because of this, the content of the unreacted raw gas may be reduced without any additional process, and thereby the production process of polysilicon may be performed more effectively.

For example, the efficiency of the silicon deposition may be greatly improved to 60 to 90% compared with 5 to 15% of the conventional method.

Further, by using the high-speed thermal plasma, the present invention may simultaneously solve the heat source necessary for heating the reaction tube and the power required for the flow inside the reaction tube, and, the separation/collecting of silicon is continuously caused by the thermal/mechanical effect transmitted by the high-temperature and high-speed air stream and since no other collection step is required, and accordingly, it is possible to provide a method for manufacturing polysilicon more economically and efficiently.

According to one embodiment, the process of the ultra-high temperature precipitation of polysilicon by the high-temperature and high-speed air stream may be performed by CVD, the method for producing polycrystalline silicon on the surface of a reaction tube is provided. In the present invention, the ultra-high temperature may mean a temperature of at least 1500 K, or at least 2000 K, preferably at least 2500 K, more preferably at least 3000 K, and may be at most 5000 K.

In addition, the temperature of the surface of the reaction tube, where adsorption and reaction of the silicon fine powder and the raw gas occur, may be 1400 K or less, preferably 1000 K or less. That is, the surface temperature of the inner wall of the reaction tube may be formed at a temperature lower than the silicon melting temperature.

The flow velocity of the high-temperature and high-speed air stream formed at the center of the reaction tube may be at least 10 m/s, or at least 100 m/s, and the maximum flow velocity at the top of the high-temperature and high-speed air stream may be at least 10 m/s, or at least 100 m/s, or at least 500 m/s, preferably at least 800 m/s, more preferably at least 1000 m/s, and may be at most 2000 m/s.

The high-temperature and high-speed air stream may be formed by a high temperature gas or a thermal plasma, and the high temperature gas and the plasma gas may be at least one gas selected from argon, helium, nitrogen, and hydrogen, and may be preferably an argon/hydrogen mixed gas, an argon/nitrogen mixed gas, an argon gas, or a nitrogen gas. In the present invention, the gas is heated to 1500 K or more, or 2000 K or more, and injected into the reaction tube at a high speed to form a high-temperature and high-speed air stream.

According to one embodiment, the thermal plasma may be a thermal microwave plasma and a high frequency plasma, but is not limited thereto.

Thermal plasma is an ionized gas composed of electrons, ions, atoms and molecules generated from a plasma torch using microwave or high frequency inductively coupled discharge, and is in a form of a high-speed jet flame with an ultra-high temperature ranging from thousands to tens of thousands K and a high heat capacity, and is a state of the fourth substance which has extreme physical and chemical properties which are completely different from those of solid, liquid, and gas. As the plasma generation gas for generating the thermal plasma, an inert gas such as argon (Ar) gas, helium, nitrogen, or hydrogen may be used, preferably argon gas, more preferably argon gas and hydrogen may be used together.

The pressure in the nozzle and the reaction tube for supplying the high-temperature and high-speed air stream may vary depending on various conditions. For example, it is preferably about 50 Torr to about 800 Torr. A reducing gas is supplied together with the chlorosilane gas to suppress the formation of dangling bonds, and the reducing gas is preferably hydrogen. The amount of the reducing gas relative to the raw gas may be supplied in an amount of 5 to 10% by volume.

The chlorosilane raw gas may comprise any one of monosilane, dichlorosilane, trichlorosilane (TCS), and tetrachlorosilane (STC), and trichlorosilane is most preferable. The reaction temperature, pressure and electric power of the reaction space may be preferable as high as possible.

The process of ultra-high temperature precipitation of polysilicon according to the present invention may be carried out using an apparatus for manufacturing ultra-high temperature polysilicon comprising:

a nozzle located at an upper part of the reaction tube and supplying a high-temperature and high-speed air stream to the center of the reaction tube; and a raw gas supply portion for supplying a raw gas containing a chlorosilane gas and a reducing gas, wherein the raw gas supply portion is located at the side of the reaction tube.

The nozzle has a heating area for heating the gas supplied from the front end of the nozzle to a predetermined temperature (1500K or 2000K) or more to supply a high temperature gas, and high-temperature gas is supplied at the center of the reaction tube through the nozzle to form a linear high-temperature and high-speed air stream at the center of the reaction tube.

The raw gas containing the chlorosilane and the reducing gas may be supplied from the side of the reaction tube, and may be preferably supplied at a low temperature and low speed.

The raw gas supply portion is located at the side of the reaction tube and may supply the raw gas with a predetermined angle, for example, at an angle of 90° or less.

When the raw gas is supplied in the center of the reaction tube in the same direction as the direction of the high-temperature and high-speed air stream, it may be guided by the high-temperature high-speed air stream formed at the center of the reaction tube to flow out to the lower part of the reaction tube, and this reduces the stay time and the reaction time of the raw gas. On the other hand, when the raw gas is supplied from the side, it may be guided by the vortex formed by the high-temperature high-speed air stream, and thereby the stay time and the reaction time in the high temperature region of the raw gas may be increased, and as the result, the efficiency of the process may be maximized.

FIG. 9 is a schematic view illustrating a structure of an inner wall of a reaction tube having a stepped structure according to an embodiment of the present invention. The inner wall of the reaction tube may form a stepwise structure as shown in FIG. 10, and the step structure may be formed such that the inner diameter of the reaction tube becomes larger toward the bottom of the reaction tube. From this, it is possible to improve the reaction tube body, that is, the surface area of the raw gas and the inner wall, and thereby the silicon precipitation efficiency may be further increased, and, the stepped inner wall described above may form a small vortex in each step structure, and thereby the stay time of the raw gas may be further increased. Accordingly, the production efficiency of the polysilicon may be improved.

FIGS. 10 and 11 are photographs each showing a state in which polysilicon crystal are formed in the reaction tube according to the embodiment of the present invention.

FIG. 10 shows a state after running for 195 minutes under conditions of argon (Ar) that is the gas for forming the air stream, temperature 2000K, flow velocity 30 m/s, trichlorosilane gas supply flow rate 2.4 g/min and reducing gas (hydrogen) supply flow rate 5 LPM. The polysilicon precipitation amount was 60.7 g, and the silicon deposition conversion rate relative to the feedstock was 61.0 mol % (12.9 wt %).

According to the present invention, it may be seen that the silicon crystal is grown toward the center of the reaction tube, and silicon crystal formed in a certain direction toward the center portion are desorbed by a high-speed air stream and a high-temperature heat source formed at the center of the reaction tube, thereby forming a empty space in the center of the reaction tube. In addition, the separated silicon crystal fall down to the bottom of the reaction tube and is collected, and therefore, a silicon crystal may be obtained by an easier collecting process.

The invention claimed is:

1. A method for manufacturing polysilicon comprising:
   forming a high-temperature and high-speed air stream at the center of a reaction tube and forming a vortex around the high-temperature and high-speed air stream;
   supplying a raw gas containing a chlorosilane gas and a reducing gas from the side of the reaction tube to be guided by the vortex to flow;
   forming a silicon fine powder by a reaction of the raw gas guided by the vortex;

transferring the silicon fine powder and the raw gas guided by the vortex to the inner wall of the reaction tube; and absorbing the transferred silicon fine powder and raw gas on the surface of the reaction tube and reacting to precipitate polysilicon.

2. The method for manufacturing polysilicon according to claim 1, wherein the reaction tube is in the form of a vertical reaction tube, and a high-temperature and high-speed air stream is injected at the center of the upper part of the vertical reaction tube, and the or polysilicon is desorbed and collected into the lower part the reaction tube, when the polysilicon being deposited on the inner wall of the vertical reaction tube grows larger than a predetermined size.

3. The method for manufacturing polysilicon according to claim 1, further comprising a heat releasing means for cooling the inner wall of the reaction tube, such that heat is released from the center of the reaction tube through the inner wall of the reaction tube, and polysilicon is formed by directional solidification in which polysilicon are formed in a direction opposite to the direction of heat release.

4. The method for manufacturing polysilicon according to claim 3, wherein the polysilicon is grown in a certain direction toward the center of the reaction tube opposite to the heat releasing direction in the form of a silicon rod or a whisker to be a predetermined size or more, and is then desorbed and dropped by gravity or physical stimulation.

5. The method for manufacturing polysilicon according to claim 2, wherein after the polysilicon formed on the inner wall of the reactor tube is collected, an exposed surface of remaining polysilicon is provided as a silicon growth surface in a subsequent manufacturing process.

6. The method for manufacturing polysilicon according to claim 1, wherein the polysilicon deposited on the surface of the inner wall of the reaction tube is directly or indirectly heated by radiant heat and convection heat transferred from the heat source at the center of the reaction tube, and the heated polysilicon layer supplies heat energy required for the reaction of the reaction raw materials and the silicon deposition reaction.

7. The method for manufacturing polysilicon according to claim 1, wherein the temperature of the high-temperature and high-speed air stream is 1500 K or more, and the vortex formed around the high-temperature and high-speed air stream forms a high temperature region of 1450 K or more.

8. The method for manufacturing polysilicon according to claim 1, wherein the sprayed raw gas is guided by the vortex to form a convection, and thereby the stay time of the raw gas is increased.

9. The method for manufacturing polysilicon according to claim 1, wherein the surface temperature of the inner wall of the reaction tube is 1400 K or less.

10. The method for manufacturing polysilicon according to claim 1, wherein the heat energy transferred to the inner space of the reaction tube and the inner wall of the reaction tube is convection heat generated by the vortex formed by the high-temperature and high-speed air stream.

11. The method for manufacturing polysilicon according to claim 1, wherein the polysilicon formed on the surface of the inner wall of the reaction tube grows to be a predetermined size or more, and thereby is desorbed and separated by the high-temperature and high-speed aft stream.

12. The method for manufacturing polysilicon according to claim 1, wherein speed flow is 10 m/s or more at the top portion of the high-temperature and high-speed aft stream.

13. The method for manufacturing polysilicon according to claim 1, wherein the raw material of the gas generating the high-temperature and high-speed air stream is at least one selected from argon, helium, nitrogen, and hydrogen.

14. The method for manufacturing polysilicon according to claim 1, wherein a silicon matrix is formed with polysilicon precipitated by the raw gas and the silicon fine powder adsorbed on the surface of the inner wall of the reaction tube, and with the silicon matrix as a reaction surface, the adsorption of the silicon fine powder and the reaction of the raw gas occur, and thereby polysilicon is precipitated on the silicon matrix.

15. The method for manufacturing polysilicon according to claim 14, wherein the silicon matrix forms a heated silicon layer from the thermal energy delivered by the vortex, and the heated silicon layer supplies heat energy necessary for the step of precipitating polysilicon by adsorption and reaction of the silicon fine powder and the raw gas.

* * * * *